(12) United States Patent
Averbouch et al.

(10) Patent No.: US 9,337,845 B2
(45) Date of Patent: May 10, 2016

(54) SOLVING CONSTRAINT SATISFACTION PROBLEMS USING A FIELD PROGRAMMABLE GATE ARRAY

(71) Applicant: International Business Machines Corporation, Armonk, NY (US)

(72) Inventors: Ilia Averbouch, Haifa (IL); Oded Margalit, Ramat Gan (IL); Amir Nahir, Megadim (IL); Yehuda Naveh, Haifa (IL); Gil Shurek, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 14/305,001

(22) Filed: Jun. 16, 2014

(65) Prior Publication Data

US 2015/0365092 A1    Dec. 17, 2015

(51) Int. Cl.
*H03K 19/177* (2006.01)

(52) U.S. Cl.
CPC .................. *H03K 19/17772* (2013.01)

(58) Field of Classification Search
CPC .................................................. H03K 19/17772
See application file for complete search history.

(56) References Cited

U.S. PATENT DOCUMENTS

| | | | | |
|---|---|---|---|---|
| 5,267,346 A * | 11/1993 | Maruyama | ............. | G06Q 10/04 706/45 |
| 5,392,221 A * | 2/1995 | Donath | ................. | G06F 17/505 716/113 |
| 5,937,042 A * | 8/1999 | Sofman | ................... | H04M 3/36 379/112.01 |
| 6,086,628 A * | 7/2000 | Dave | ................... | G06F 17/5045 712/28 |
| 7,386,828 B1 * | 6/2008 | Safarpour | ........... | G06F 17/5027 716/105 |
| 8,091,060 B1 * | 1/2012 | Tom | ...................... | G06F 17/505 716/108 |
| 8,296,120 B2 | 10/2012 | Phillips et al. | | |
| 8,364,616 B2 | 1/2013 | Bhatnagar | | |
| 8,397,204 B2 * | 3/2013 | Sengupta | .................. | G06F 9/50 716/132 |
| 8,447,716 B2 | 5/2013 | Bagley et al. | | |
| 8,984,464 B1 * | 3/2015 | Mihal | ................. | G06F 17/5072 716/118 |
| 2004/0059549 A1 * | 3/2004 | Kropaczek | ............. | G06Q 10/04 703/2 |
| 2012/0159119 A1 * | 6/2012 | Sengupta | .................. | G06F 9/50 712/1 |
| 2013/0117215 A1 | 5/2013 | Bin | | |
| 2013/0124164 A1 | 5/2013 | Jha et al. | | |

OTHER PUBLICATIONS

Safir et al.; "Floorplanning with Datapath Optimization"; IEEE; 1995; pp. 41-44.*
Davis et al., "A practical reconfigurable hardware accelerator for boolean satisfiability solvers.", In Proceedings of the 45th Design Automation Conference DAC, Jun. 8-13, 2008, USA.

(Continued)

*Primary Examiner* — Naum B Levin (57) ABSTRACT

A method for configuring a Field Programmable Gate Array (FPGA) with a Constraint Satisfaction Problem (CSP) assignment having multiple constraint expressions, the method comprising: setting each of the multiple constraint expressions as a configurable logic block (CLB) in the FPGA, to yield multiple CLBs; setting an assignment vector in the FPGA, wherein the assignment vector is a number vector configured to store a candidate solution to the CSP assignment; and forming a feedback loop by connecting the assignment vector to inputs of the multiple CLBs, and connecting outputs of the multiple CLBs to the assignment vector. Further disclosed is a design structure for the FPGA, optionally residing on a storage medium as a data format used for the exchange of layout data of integrated circuits.

20 Claims, 4 Drawing Sheets

(56) References Cited

OTHER PUBLICATIONS

Gulati et al., "FPGA-based hardware acceleration for boolean satisfiability.", ACM Transactions on Design Automation of Electronic Systems (TODAES) TODAES Homepage archive, vol. 14 Issue 2, Mar. 2009, Article No. 33.

Habbas et al., "A methodological approach to implement CSP on FPGA.", In Proceedings of the Tenth IEEE International Workshop on Rapid System Prototyping, RSP '99, Jul. 1999, pp. 66-71.

Haller et al., "Relieving capacity limits on FPGA-based SAT-solvers.", In Proceedings of the 2010 Conference on Formal Methods in Computer-Aided Design, FMCAD '10, pp. 217-220, 2010.

Hamadi et al., "Reconfigurable architectures: A new vision for optimization problems.", In: Proceedings of the 3rd International Conference on Principle and Practice of Constraint Programming CP97, vol. 1330 of Lecture Notes in Computer Science, pp. 209-221, Springer 1997.

Kanazawa et al., "An FPGA solver for WSAT algorithms.", International Conference on Field Programmable Logic and Applications, pp. 83-88, Aug. 2005.

Kanazawa et al., "An approach for solving large SAT problems on FPGA.", ACM Transactions on Reconfigurable Technology and Systems (TRETS), vol. 4 Issue 1, Dec. 2010, Article No. 10.

Shiozawa et al., "A hardware implementation of constraint satisfaction problem based on new reconfigurante LSI architecture.", In Field-Programmable Logic and Applications from FPGAs to Computing Paradigm; Lecture notes in Computer Science vol. 1482, 1998, pp. 426-430.

Skliarova et al., "Reconfigurable hardware SAT solvers: A survey of systems.", IEEE Transactions on Computers, vol. 53, No. 11, Nov. 2004, pp. 1449-1461.

Yung et al,. "A runtime reconfigurable implementation of the GSAT algorithm.", FPL '99 Proceedings of the 9th International Workshop on Field-Programmable Logic and Applications, pp. 526-531, 1999.

Welp et al., "Hardware Acceleration for Constraint Solving for Random Simulation", IEEE Transactions on Computer-Aided Design of Integrated Circuits and Systems, vol. 31, Issue 5, pp. 779-789, May 2012.

Roland et al., "Hardware Implementations of Real-Time Reconfigurable WSAT Variants", Field PRogrammable Logic and Application, Lecture Notes in Computer Science vol. 2778, 2003, pp. 488-496, Springer 2003.

\* cited by examiner

SOLVING CONSTRAINT SATISFACTION PROBLEMS USING A FIELD PROGRAMMABLE GATE ARRAY

BACKGROUND

The invention relates to the field of Field Programmable Gate Arrays (FPGAs).

Microprocessors such as the PowerPC and x86 lines have been the traditional work-horses of computing systems over the years. While they offer post-fabrication flexibility through software programmability, the demand for on-board autonomy-enabling applications has pushed the envelope of computation complexity far beyond the reach of these processors. Application-Specific Integrated Circuits (ASICs), while being capable of meeting the computation demands of these algorithms, incur very high NRE (non-recurring engineering) costs and offer little to no flexibility for algorithmic changes in the post-deployment/fabrication phase. FPGAs are gaining increasingly strong support in the computing community as the platform of choice for applications, because they offer the best of both ASIC and microprocessor worlds. Today's state-of-the-art FPGAs have low cost, high capability and nearly-zero NRE. FPGA-based designs can be deployed as-is or converted to a low-cost structured ASIC.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

One embodiment provides a method for configuring a Field Programmable Gate Array (FPGA) with a Constraint Satisfaction Problem (CSP) assignment having multiple constraint expressions, the method comprising: setting each of the multiple constraint expressions as a configurable logic block (CLB) in the FPGA, to yield multiple CLBs; setting an assignment vector in the FPGA, wherein the assignment vector is a number vector configured to store a candidate solution to the CSP assignment; and forming a feedback loop by connecting the assignment vector to inputs of the multiple CLBs, and connecting outputs of the multiple CLBs to the assignment vector.

In some embodiments, the method further comprises connecting the outputs of the multiple CLBs to a program terminator.

In some embodiments, each of the multiple CLBs comprises one or more logical gates.

In some embodiments, each of the one or more logical gates is selected from the group consisting of a flip-flop and a lookup table (LUT).

In some embodiments, in the forming of the feedback loop, outputs of the multiple CLBs are connected to respective inputs of the multiple CLBs, such that each one of the outputs is connected to a single one of the inputs.

In some embodiments, in the forming of the feedback loop, outputs of the multiple CLBs are connected to inputs of the multiple CLBs through arbitration logic.

In some embodiments, the arbitration logic defines a global objective function, such that, when solving the CSP assignment, an output of the global objective function is transmitted to the inputs of the multiple CLBs.

In some embodiments, the connecting of the assignment vector to the inputs of the multiple CLBs comprises connecting a cell of the assignment vector to multiple ones of the inputs of the multiple CLBs.

In some embodiments, the connecting of the assignment vector to the inputs of the multiple CLBs comprises connecting a cell of the assignment vector to one of the inputs of the multiple CLBs.

In some embodiments, the method further comprises solving the CSP assignment by executing a stochastic local search which comprises: (a) initializing the assignment vector of the FPGA with initial values; and (b) during at least one clock cycle of the FPGA: (i) inputting the values of the assignment vector to the inputs of the CLBs, (ii) calculating a state of each of the multiple CLBs in parallel, (iii) outputting new values from outputs of the multiple CLBs, and adjusting the values of the assignment vector based on the new values, and (iv) terminating the stochastic local search when the adjusted values of the assignment vector are a solution to the CSP assignment.

In some embodiments, the initializing is selected from the group consisting of: random initialization, pseudo-random initialization and user-defined initialization.

In some embodiments, the at least one clock cycle of the FPGA is multiple clock cycles of the FPGA.

In some embodiments, the method further comprises: repeating step (b) until all the multiple constraint expressions are satisfied.

In some embodiments, the method further comprises: repeating step (b) and updating a heuristic mechanism following each repetition; ceasing the repeating of step (b) upon indication by the heuristic mechanism.

In some embodiments, the heuristic mechanism comprises a counter of clock cycles, and wherein the indication by the heuristic mechanism comprises an indication that a predetermined number of clock cycles has been reached.

In some embodiments, the heuristic mechanism comprises a tracking of the outputs of the multiple CLBs over multiple clock cycles of the FPGA, and wherein the indication by the heuristic mechanism comprises an indication that one or more of the outputs of the multiple CLBs have not sufficiently changed.

In some embodiments, the heuristic mechanism comprises a tracking of the outputs of the multiple CLBs over multiple clock cycles of the FPGA, and wherein the indication by the heuristic mechanism comprises an indication that one or more of the outputs of the multiple CLBs have sufficiently changed.

Another embodiment provides a Field Programmable Gate Array (FPGA) configured to solve a Constraint Satisfaction Problem (CSP) assignment having multiple constraint expressions, the FPGA comprising: multiple configurable logic blocks (CLBs) each set with one of the multiple constraint expressions; an assignment vector being a number vector configured to store a candidate solution to the CSP assignment; and a feedback loop connecting the assignment vector to inputs of the multiple CLBs, and further connecting outputs of the multiple CLBs to the assignment vector.

A further embodiment provides a design structure readable by a machine used in design, programming or simulation of a Field Programmable Gate Array (FPGA), the design structure comprising: multiple configurable logic blocks (CLBs) each set with one of the multiple constraint expressions; an assignment vector being a number vector configured to store a candidate solution to the CSP assignment; and a feedback loop connecting the assignment vector to inputs of the multiple CLBs, and further connecting outputs of the multiple CLBs to the assignment vector.

In some embodiments, the design structure resides on a storage medium as a data format used for the exchange of layout data of integrated circuits.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Disclosed herein is a method for configuring (also "programming") a Field Programmable Gate Array (FPGA) with a constraint satisfaction problem, such that the CSP may be efficiently solved by executing a stochastic local search using the FPGA. Further disclosed are an FPGA programmed in accordance with the aforesaid method, as well as a design structure readable by a machine used in the design, manufacture and/or simulation of the FPGA.

Constraint satisfaction problems (CSPs), as known in the art, are a type of optimization problems. Optimization problems are widespread. In particular, business optimization problems are prevalent in many businesses, and in many parts of the business. Recently, a lot of attention has been given to the technology being used to solve business problems, as management is very much aware that better optimization technology may sometimes be the differentiating factor against competition. This increases the value of generic optimization solutions, and puts a pressure to develop better and faster solutions. In addition, as the problem is typically not well defined at early stages of business decisions, the solving mechanism should be flexible and easily and rapidly changeable to solve many different problems. This implies the need for generic and fast optimization solvers.

Optimization problems are usually composed of two parts: an objective function (OF) to be minimized, and a set of constraints to be satisfied. When the constraints part is the more important one, or the harder to solve, then the problem may be categorized as a constraint satisfaction problem (CSP). In such cases, the OF may be eliminated altogether by solving the CSP a number of times, each time with an added constraint, to find a solution with a better OF value.

FPGAs, whose advantageous usage for solving CSPs is disclosed herein, are a type of integrated circuits (ICs) programmable by the user. Unlike application-specific integrated circuits (ASICs), the gates of an FPGA are not fabricated on silicon at the manufacturing stage, and therefore their hardware logic can change from time to time, depending on how it is programmed. FPGAs have proved to be highly successful in some applications, notably signal processing and image processing. Typically, a hardware implementation (i.e. one which utilizes FPGAs, ASICs or the like) is advantageous when it is estimated to be much stronger than software, for example when the solution can be highly parallelized at the lowest levels of the hardware. FPGA implementation, specifically, may be especially useful if there are many sufficiently-different problems to be solved, and the problems are not necessarily known in advance.

Furthermore, present embodiments of the FPGA, its configuration method and design structure, may utilize stochastic CSP solution algorithms rather than systematic ones. Stochastic algorithms are considered to be much more suitable for parallelization than systematic algorithms, hence providing considerably higher speed.

In present embodiments, the assignment vectors are populated numerous times until a solution to the CSP assignment is reached. Although the assignment vectors are somewhat influenced by feedback from the CLB outputs, the basic approach of present embodiments may be referred to as "brute force", in the sense that it relies on the ability to very rapidly check a huge number of candidate solutions. This is possible, of course, only if the entire calculation of constraints is done in parallel. Software implementations of CSP solvers are normally incapable of such massive parallelism, and hence have to resort to much slower techniques, such as various heuristics, which are still time-consuming.

Figure 1:
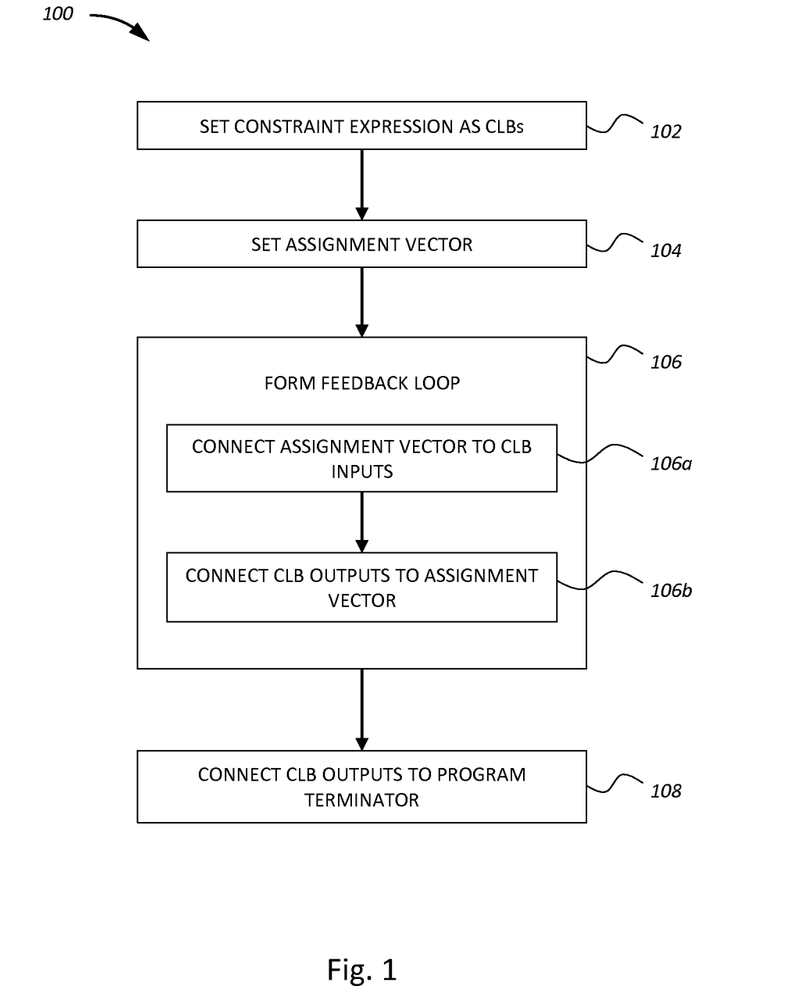
FIG. 1 shows a flow chart of a method for configuring an FPGA with a CSP assignment.

Reference is now made to FIG. 1, which shows a flow chart of a method 100 for configuring an FPGA with a CSP assignment. The term "assignment", as referred to herein, may relate to a specific instance of a CSP, for example a business problem with particular constraints. Method 100 may be carried out by a machine configured to connect to the FPGA and feed it with programming signals. Steps of method 100 are not necessarily carried out in the order in which they appear.

The CSP assignment may include a plurality of constraint expressions which need to be satisfied in the course of solving the CSP assignment. The structure of such constraint expressions is known in the art.

In a step 102, each of these constraint expressions may be set as a configurable logic block (CLB) in the FPGA, thereby yielding multiple CLBs. Each such CLB may include one or multiple logical gates configured and arranged to embody the corresponding constraint expression. The gates may include flip-flops, lookup tables (LUTs), etc., as known in the art. Each CLB may include an input port and an output port (or simply "input" and "output").

In a step 104, an assignment vector may be set in the FPGA. The assignment vector may be a number vector configured to store (i.e. be populated with) a solution candidate to the CSP assignment. Namely, the assignment vector may include a cell for each variable of the CSP assignment, wherein the cells, jointly, store a candidate solution to the assignment. A bit length of numbers in the various cells may be the same or different, depending on the nature of the variables, as defined in the CSP assignment.

In a step 106, a feedback loop may be formed in the FPGA. In a sub-step 106a, the assignment vector may be connected to the inputs of the CLBs. Each cell of the assignment vector may either be connected to one input (of one CLB), to multiple inputs (of multiple CLBs), or not connected to any inputs at all.

In a sub-step 106b, the outputs of the CLBs may be connected to the assignment vector. A number of options for carrying out step 106b may exist. A first option is to connect the output of each CLB, through the assignment vector, back to the input of that same CLB. Namely, all outputs of the CLBs are connected to respective inputs of the CLBs through their respective assignment vectors, in a one-to-one connection. A second option is to connect outputs of some CLBs, through their respective assignment vectors, back to an input of one of these CLBs. A third option is to connect outputs of all CLBs back to an input of one of these CLBs; to this end, arbitration logic may be configured in the FPGA. The arbitration logic may include one or more gates, defining a global objective function. This way, when solving the CSP assignment, an output of the global objective function is transmitted to the inputs of all CLBs, which are connected to the arbitration logic.

In a step 108, outputs of one or more of the CLBs may be connected to a program terminator. The program terminator may be a logic unit configured to determine and indicate if all constraint expressions have been solved and/or if there is another reason to restart a solving session.

Figure 2:
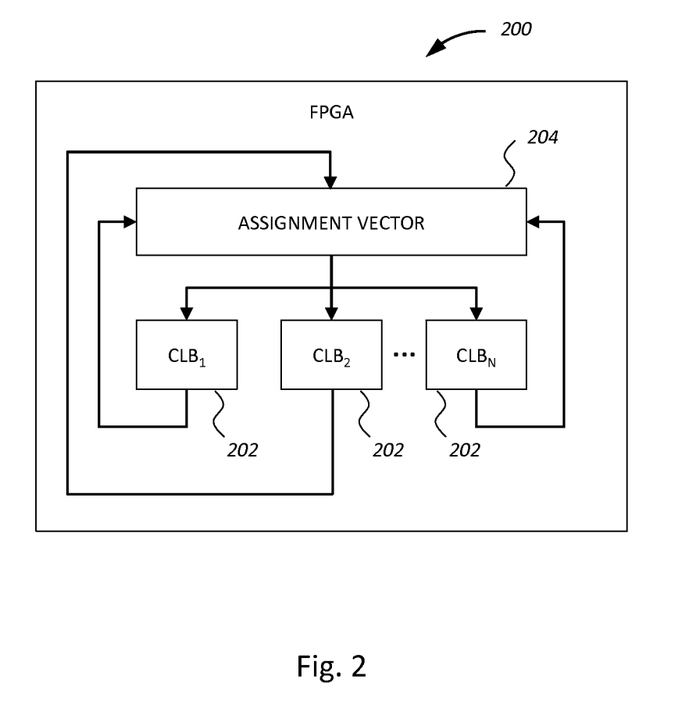
FIG. 2 shows a block diagram of an exemplary FPGA programmed with a CSP assignment.

In an embodiment, an FPGA configured to solve a CSP assignment is provided, wherein the FPGA has been configured in accordance with method 100. FIG. 2 shows a block diagram of such exemplary FPGA 200. FPGA 200 may be provided programmed with CLBs 202 for the constraint expressions, an assignment vector 204 configured to store a solution candidate to the CSP assignment, and a feedback loop between inputs and outputs, via the assignment vector.

In a further embodiment, a design structure of FPGA 200 is provided, wherein the design structure is readable by a machine in order to design, program and/or simulate the FPGA in accordance with the discussions above with regard to FIGS. 1-2. The design structure may reside (i.e. be stored) on a storage medium which is optionally non-transient (also "non-volatile"). The design structure may have a data format used for the exchange of layout data of integrated circuits, as known in the art and further discussed below.

Figure 3:
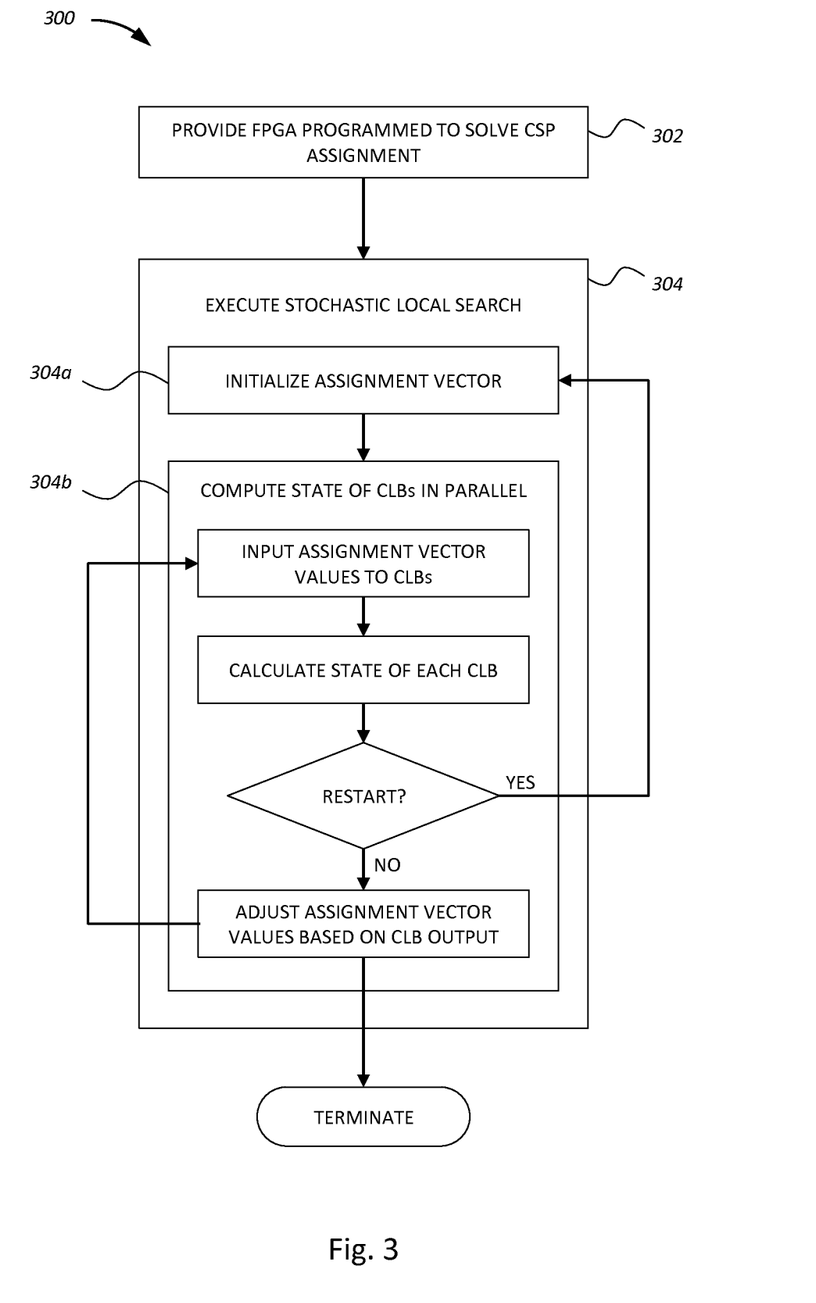
FIG. 3 shows a flow chart of a method for solving a CSP assignment using an FPGA.

Reference is now made to FIG. 3, which shows a flow chart of a method 300 for solving the CSP assignment discussed in relation to FIG. 1. Method 300 may be carried out by the same entity which carried out method 100 (FIG. 1) for example by the same business organization or individual. Alternatively, the entities carrying out methods 300 and 100 may be different. Methods 100 and 300 may be carried out successively, as one lengthier method.

Method 300 may include, initially, a step 302 of providing of an FPGA programmed to solve the CSP assignment. An embodiment of this FPGA is discussed above.

In a step 304, a stochastic local search may be executed using the FPGA, in order to solve the CSP assignment. In a sub-step 304a, the assignment vector of the FPGA may be initialized with initial values, representing a solution candidate to the CSP assignment. Namely, each cell of the assignment vector may be assigned with a number. The initialization may be random, for example by employing a hardware random number generator programmed in the FPGA. This generator may generate random numbers from a physical process, such as from thermal noise sensed by the circuitry of the generator. Alternatively, the initialization may be pseudo-random, for example as provided by a service of the FPGA. Pseudo-random initialization may use a deterministic algorithm which uses an initial number (a "seed") as input, and outputs a number; the algorithm is complex enough such that the output and input seem entirely uncorrelated. Further alternatively, the initialization may be user-defined, at least partially. Namely, user-defined and random or pseudo-random initialization may be combined.

In a sub-step 304b, parallel computation of a state of each of the CLBs may be performed. To this end, during at least one clock cycle of the FPGA, the following three operations may take place: the values of the assignment vector may be input to the inputs of the CLBs, in parallel. Then, the state of each of the CLBs may be calculated, based on the inputs, in parallel. Finally, new values resulting from the calculation may be outputted from the outputs of the CLBs, and the values of the assignment vector may be adjusted based on these new values. If the adjusted values of the assignment vector constitute a solution to the CSP assignment, method 300 may terminate.

In one embodiment, sub-step 304b may be performed once in every clock cycle of the FPGA, while in a different embodiment, sub-step 304b may span over multiple clock cycles and hence be repeated only once every few clock cycles.

The repetition of sub-step 304b may be controlled by the program terminator. The program terminator may terminate the repetition when all of the constraint expressions are satisfied. For example, in the program terminator, outputs of all CLBs may be added (e.g. using AND logic) and a TRUE result indicates that the constraint expressions have been satisfied.

Alternatively, the program terminator may include a heuristic mechanism which indicates when to cease the repetition even if not all constraint expressions are yet satisfied. In one embodiment, the heuristic mechanism may include a counter of clock cycles, and the indication to cease the repetition is given once a predetermined number of clock cycles has been reached. In another embodiment, the heuristic mechanism may track outputs of some or all CLBs over multiple clock cycles, to indicate when these outputs reach a certain threshold (namely, when they have been sufficiently changed). Alternatively, the indication may be given if the outputs have not reached a certain threshold after a predetermined number of clock cycles, namely—they have not sufficiently changed during an allotted time period. In a further embodiment, the heuristic mechanism may track a value of the global objective function over multiple clock cycles, to indicate if the global objective function has reached a certain threshold, or if a certain threshold has not been reached during an allotted time period.

Figure 4:
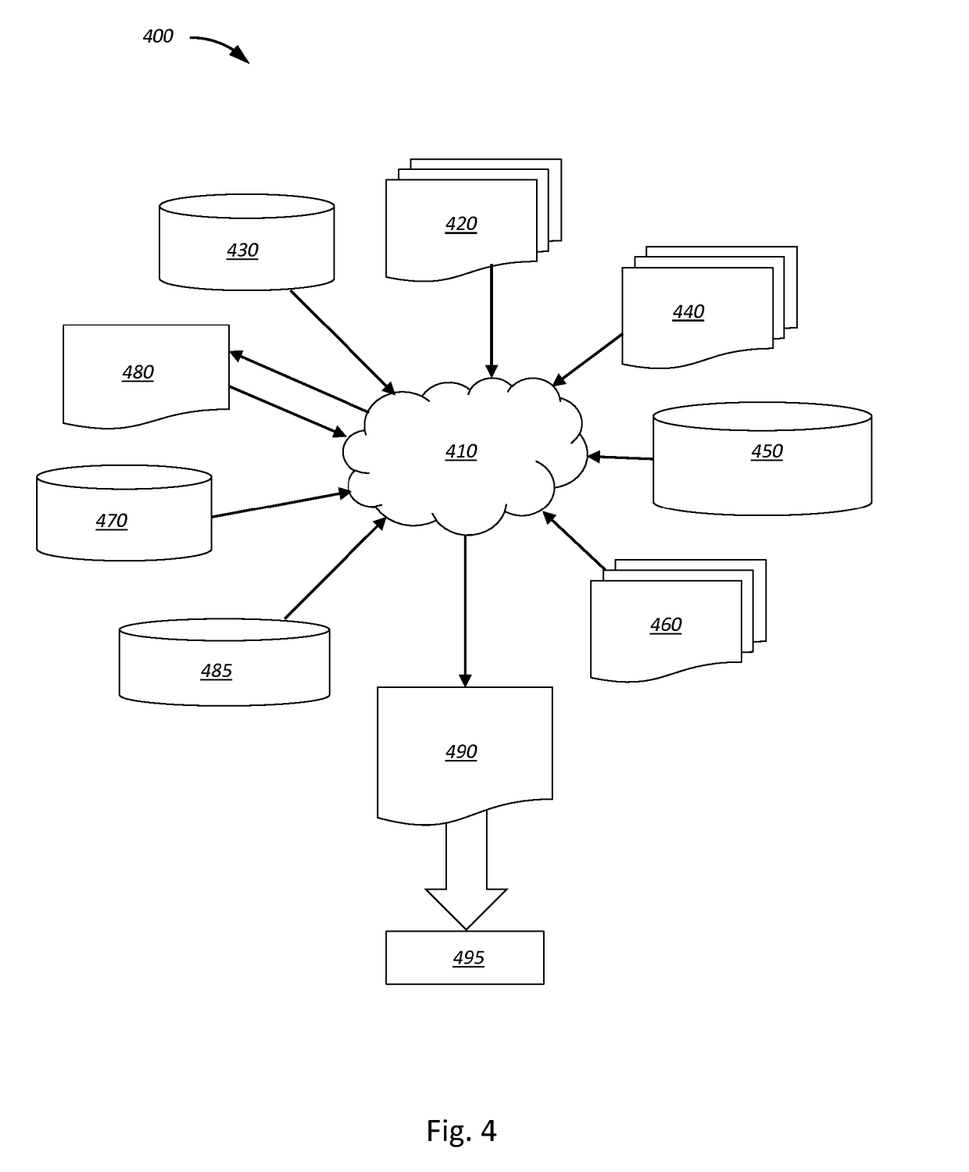
FIG. 4 shows a flow diagram of a design process used in integrated circuit design, manufacture, programming, simulation and/or testing.

Reference is now made to FIG. 4, which shows a block diagram of an exemplary design flow 400 used, for example, in logic design, simulation, test, layout and/or programming of the FPGA. Design flow 400 includes processes, machines and/or mechanisms for processing design structures or devices to generate logically or otherwise functionally equivalent representations of the design structures and/or devices described above and shown in FIGS. 1-3. The design structures processed and/or generated by design flow 400 may be encoded on machine-readable transmission or storage media to include data and/or instructions that, when executed or otherwise processed on a data processing system, generate a logically, structurally, mechanically, or otherwise functionally-equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 400 may vary depending on the type of representation being designed. For example, a design flow 400 for building an application specific IC (ASIC) may differ from a design flow 400 for designing a standard component or from a design flow 400 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 420 that may be processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer. When encoded on a machine-readable data transmission, gate array, or storage medium, design structure 420 may be accessed and processed by one or more hardware and/or software modules within design process 410 to simulate or otherwise functionally represent an electronic component, circuit, electronic or logic module, apparatus, device, or system such as those shown in FIGS. 1-3. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 may employs and incorporate hardware and/or software modules for synthesizing, translating, or otherwise processing a design/simulation functional equivalent of the components, circuits, devices, or logic structures shown in FIGS. 1-3 to generate a netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is resynthesized one or more times depending on design specifications and parameters for the device. As with other design structure types described herein, netlist 480 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 410 may include hardware and software modules for processing a variety of input data structure types including netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 40 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 410 without deviating from the scope and spirit of the invention. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures along with any additional mechanical design or data (if applicable), to generate a second design structure 440. Design structure 440 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 420, design structure 440 may comprise one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 440 may comprise a compiled, executable HDL simulation model that functionally simulates the devices shown in FIGS. 1-3.

Design structure 440 may also employ a data format used for the exchange of layout data of integrated circuits and/or symbolic data format (e.g. information stored in a GDSII (GDS2), GL1, OASIS, map files, or any other suitable format for storing such design data structures). Design structure 440 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 440 may then proceed to a stage 445 where, for example, design structure 440: proceeds to tape-out, is released to manufacturing, is released to a mask house, is sent to another design house, is sent back to the customer, etc.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for configuring a Field Programmable Gate Array (FPGA) with a Constraint Satisfaction Problem (CSP) assignment having multiple constraint expressions, the method comprising:
using a machine:
setting each of the multiple constraint expressions as a configurable logic block (CLB) in the FPGA, to yield multiple CLBs;
setting an assignment vector in the FPGA, wherein the assignment vector is a number vector configured to store a candidate solution to the CSP assignment; and
forming a feedback loop by connecting the assignment vector to inputs of the multiple CLBs, and connecting outputs of the multiple CLBs to the assignment vector.

2. The method according to claim 1, further comprising connecting the outputs of the multiple CLBs to a program terminator.

3. The method according to claim 1, wherein each of the multiple CLBs comprises one or more logical gates.

4. The method according to claim 3, wherein each of the one or more logical gates is selected from the group consisting of a flip-flop and a lookup table (LUT).

5. The method according to claim 1, wherein, in the forming of the feedback loop, outputs of the multiple CLBs are connected to respective inputs of the multiple CLBs, such that each one of the outputs is connected to a single one of the inputs.

6. The method according to claim 1, wherein, in the forming of the feedback loop, outputs of the multiple CLBs are connected to inputs of the multiple CLBs through arbitration logic.

7. The method according to claim 6, wherein the arbitration logic defines a global objective function, such that, when solving the CSP assignment, an output of the global objective function is transmitted to the inputs of the multiple CLBs.

8. The method according to claim 1, wherein the connecting of the assignment vector to the inputs of the multiple CLBs comprises connecting a cell of the assignment vector to multiple ones of the inputs of the multiple CLBs.

9. The method according to claim 1, wherein the connecting of the assignment vector to the inputs of the multiple CLBs comprises connecting a cell of the assignment vector to one of the inputs of the multiple CLBs.

10. The method according to claim 1, further comprising solving the CSP assignment by executing a stochastic local search which comprises:

(a) initializing the assignment vector of the FPGA with initial values; and
(b) during at least one clock cycle of the FPGA: (i) inputting the values of the assignment vector to the inputs of the CLBs, (ii) calculating a state of each of the multiple CLBs in parallel, (iii) outputting new values from outputs of the multiple CLBs, and adjusting the values of the assignment vector based on the new values, and (iv) terminating the stochastic local search when the adjusted values of the assignment vector are a solution to the CSP assignment.

11. The method according to claim 10, wherein the initializing is selected from the group consisting of: random initialization, pseudo-random initialization and user-defined initialization.

12. The method according to claim 10, wherein the at least one clock cycle of the FPGA is multiple clock cycles of the FPGA.

13. The method according to claim 10, further comprising:
repeating step (b) until all the multiple constraint expressions are satisfied.

14. The method according to claim 10, further comprising:
repeating step (b) and updating a heuristic mechanism following each repetition;
ceasing the repeating of step (b) upon indication by the heuristic mechanism.

15. The method according to claim 14, wherein the heuristic mechanism comprises a counter of clock cycles, and wherein the indication by the heuristic mechanism comprises an indication that a predetermined number of clock cycles has been reached.

16. The method according to claim 14, wherein the heuristic mechanism comprises a tracking of the outputs of the multiple CLBs over multiple clock cycles of the FPGA, and wherein the indication by the heuristic mechanism comprises an indication that one or more of the outputs of the multiple CLBs have not sufficiently changed.

17. The method according to claim 14, wherein the heuristic mechanism comprises a tracking of the outputs of the multiple CLBs over multiple clock cycles of the FPGA, and wherein the indication by the heuristic mechanism comprises an indication that one or more of the outputs of the multiple CLBs have sufficiently changed.

18. A Field Programmable Gate Array (FPGA) configured to solve a Constraint Satisfaction Problem (CSP) assignment having multiple constraint expressions, the FPGA comprising:
multiple configurable logic blocks (CLBs), each set with one of the multiple constraint expressions;
an assignment vector being a number vector configured to store a candidate solution to the CSP assignment; and
a feedback loop connecting the assignment vector to inputs of the multiple CLBs, and further connecting outputs of the multiple CLBs to the assignment vector.

19. A design structure readable by a machine used in design, programming or simulation of a Field Programmable Gate Array (FPGA), the design structure comprising:
multiple configurable logic blocks (CLBs) each set with one of the multiple constraint expressions;
an assignment vector being a number vector configured to store a candidate solution to the CSP assignment; and
a feedback loop connecting the assignment vector to inputs of the multiple CLBs, and further connecting outputs of the multiple CLBs to the assignment vector.

20. The design structure according to claim 19, residing on a storage medium as a data format used for the exchange of layout data of integrated circuits.

\* \* \* \* \*